(12) United States Patent
Sun et al.

(10) Patent No.: US 10,727,640 B2
(45) Date of Patent: Jul. 28, 2020

(54) MULTI-WAVELENGTH LASER

(71) Applicant: INTEL CORPORATION, Santa Clara, CA (US)

(72) Inventors: Jie Sun, Mountain View, CA (US); Haisheng Rong, Pleasanton, CA (US); Ranjeet Kumar, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/233,687

(22) Filed: Dec. 27, 2018

(65) Prior Publication Data

US 2019/0140415 A1     May 9, 2019

(51) Int. Cl.
| | |
|---|---|
| *H04J 14/02* | (2006.01) |
| *H01S 3/067* | (2006.01) |
| *H01S 3/00* | (2006.01) |
| *H01S 3/08* | (2006.01) |
| *G02B 6/12* | (2006.01) |
| *H04B 10/50* | (2013.01) |

(52) U.S. Cl.
CPC ........ *H01S 3/0675* (2013.01); *G02B 6/12007* (2013.01); *H01S 3/0085* (2013.01); *H01S 3/08086* (2013.01); *H04B 10/506* (2013.01); *H04J 14/0227* (2013.01); *H04J 14/0256* (2013.01)

(58) Field of Classification Search
CPC .... H04J 14/02; H04J 14/0201; H04J 14/0202; H04B 10/506; H04B 10/40; H04B 10/505; H04B 10/503; H04B 10/5051; H04B 10/5053; H04B 10/541; G02B 6/2938; G02B 6/12007
USPC .. 398/79, 83, 84, 85, 87, 91, 158, 159, 135, 398/136, 182, 183, 186, 188, 200, 201, 398/192, 193, 194; 385/24, 37; 372/32, 372/34, 36, 38.02, 96, 20
See application file for complete search history.

(56) References Cited

U.S. PATENT DOCUMENTS

| | | | | |
|---|---|---|---|---|
| 5,459,799 | A | * | 10/1995 | Weber ..................... G02F 1/011 359/288 |
| 8,831,051 | B2 | * | 9/2014 | Liu ..................... H01S 5/06256 372/102 |
| 10,020,636 | B2 | * | 7/2018 | Zheng ................. H01S 5/06258 |
| 10,120,211 | B2 | * | 11/2018 | Zheng ................. G02B 6/4215 |

* cited by examiner

*Primary Examiner* — Hanh Phan
(74) *Attorney, Agent, or Firm* — Patent Capital Group

(57) ABSTRACT

There is disclosed in one example a communication system, including: a data transmission interface; and a wavelength division multiplexing (WDM) silicon laser source to provide modulated data on a carrier laser via the data transmission interface, the WDM laser including a single laser cavity to generate an internally multiplexed multi-wavelength laser, the single laser cavity including a filter having a first grating period to generate a first wavelength and a second grating period to generate a second wavelength, the second grating period superimposed on the first grating period.

20 Claims, 9 Drawing Sheets

MULTI-WAVELENGTH LASER

FIELD OF THE SPECIFICATION

This disclosure relates in general to the field of fiberoptic communication, and more particularly, though not exclusively, to a system for providing a multi-wavelength fiberoptic laser.

BACKGROUND

Fiberoptic communication is a method of communicating information via modulated light pulses.

BRIEF DESCRIPTION OF THE DRAWINGS

The present disclosure is best understood from the following detailed description when read with the accompanying FIGURES. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

EMBODIMENTS OF THE DISCLOSURE

Figure 1:
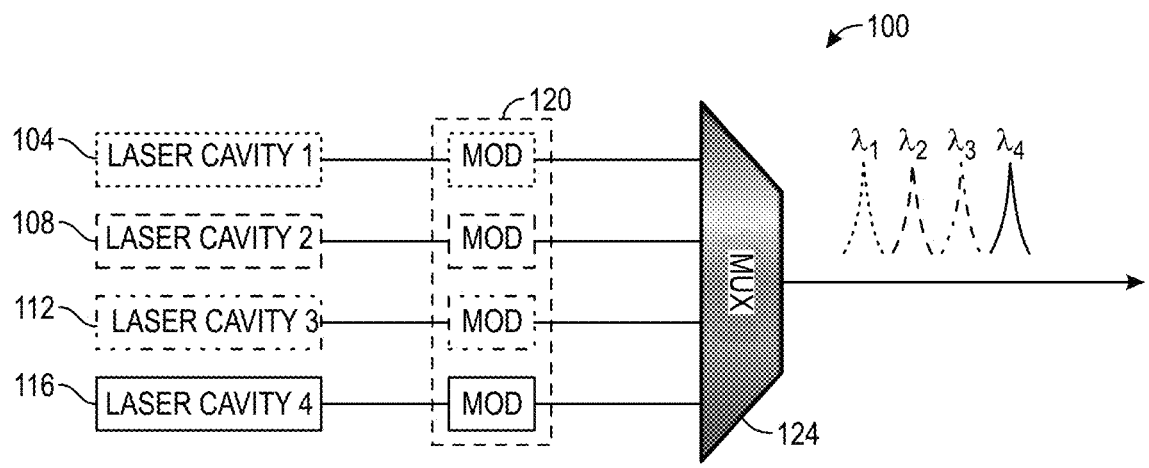
FIG. 1 is a block diagram of a wavelength division multiplexing (WDM) system.

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different FIGURES. This repetition is for the purpose of simplicity and clarity and does not in itself dictate a specific relationship between the various embodiments and/or configurations discussed. Different embodiments may have different advantages, and no particular advantage is necessarily required of any embodiment.

A contemporary computing platform may include a complex and multi-faceted hardware platform provided by Intel®, another vendor, or combinations of different hardware from different vendors. For example, in a large data center such as may be provided by a cloud service provider (CSP) or a high-performance computing (HPC) cluster, the hardware platform may include rack-mounted servers with compute resources such as processors, memory, storage pools, accelerators, and other similar resources. As used herein, "cloud computing" includes network-connected computing resources and technology that enables ubiquitous (often worldwide) access to data, resources, and/or technology. Cloud resources are generally characterized by flexibility to dynamically assign resources according to current workloads and needs. This can be accomplished, for example, by assigning a compute workload to a guest device, wherein resources such as hardware, storage, and networks are provided to a virtual machine, container, or disaggregated node by way of nonlimiting example.

In embodiments of the present disclosure, a processor may include any programmable logic device with an instruction set. Processors may be real or virtualized, local or remote, or in any other configuration. A processor may include, by way of nonlimiting example, an Intel® processor (e.g., Xeon®, Core™, Pentium®, Atom®, Celeron®, x86, or others). A processor may also include competing processors, such as AMD (e.g., Kx-series x86 workalikes, or Athlon, Opteron, or Epyc-series Xeon workalikes), ARM processors, or IBM PowerPC and Power ISA processors, to name just a few.

Communication speed and latency are premium considerations in a modern data center. Particularly, because many enterprises are moving both computing and storage resources to the cloud, cloud data centers may be required to handle very large volumes of data. The volumes and speed of data required in such data centers often exceed the capacity of traditional copper-based electrical interconnects, and may require faster technologies, such as fiberoptic interconnects. Fiberoptic interconnects are especially useful in longer data paths, such as between a rack and a spine switch in a leaf/spine network, or in some other configuration.

Communication density may also be a primary consideration in data centers such as cloud data centers that handle large volumes of traffic. In these data centers, the volume of data that can be carried on a physical cable profile can actually be a limiting factor. Cable bundles can become large and unwieldy if transmission densities are not increased.

In fiberoptic communication, communication density may be specified in terms of gigabits (Gbs) per second, per wavelength. For example, data modulated onto a first wavelength may have a maximum speed of 25 Gb per second. To increase the overall communication density of the fiberoptic cable, information may be encoded onto other wavelengths in the same carrier signal. For example, if four different wavelengths have data modulated onto them, and each has a speed of 25 Gb per second, then the fiberoptic interconnect has an overall effective communication speed of 100 Gb per second. Conceptually, this is similar to cable television, where video feeds on the same cable may be encoded onto different carrier frequencies, and a receiver can isolate the correct information by demodulating a particular carrier frequency.

Traditionally, the multiple transmission modes may be superimposed into the same carrier pulse by four different laser cavities that generate lasers at four different frequencies with four corresponding wavelengths. Data may then be modulated onto each of the four wavelengths coming from the four laser cavities. Finally, the four modulated signals are frequency multiplexed together into a single light pulse that is transmitted out on the fiberoptic cable. While this configuration works well, it also consumes a large amount of semiconductor chip surface in a manufactured product. As integrated chip manufacturers continue to try to put more and more components onto a single silicon wafer, the available surface area becomes more constrained. It is therefore desirable to design solutions that consume less surface area.

To realize a multimode laser that consumes less surface area, the present specification describes a single-cavity laser that provides a plurality of wavelengths through the single cavity. Not only does this eliminate the requirement for multiple laser cavities, but it also eliminates the need for a multiplexer, and allows the use of relatively small ring modulators to modulate data onto the four carrier wavelengths.

In an illustrative example, the single wavelength uses a novel Bragg filter to generate a laser with four available wavelengths for data transmission. Traditionally, a Bragg filter is designed with slits that are spaced with a period of one-quarter wavelength of the selected wavelength. The Bragg filter therefore reflects the selected wavelength, while allowing all other wavelengths to pass through. The Bragg filter can therefore be used to select a single specific wavelength for a laser pulse. A Bragg filter constructed according to the present specification is designed so as to reflect two or more (e.g., two, three, or four) wavelengths while passing all others. This is accomplished by superimposing the periods of the second, third, and fourth Bragg filters onto the period of the first Bragg filter, thus creating a composite Bragg filter. The present specification also illustrates techniques to make such a Bragg filter more practically manufacturable.

By manufacturing a single-cavity multimode laser according to the teachings of the present specification, a system designer can realize a multimode communication laser capable of high communication density, and with a reduced silicon footprint on an integrated circuit.

A system and method for providing a multi-wavelength laser will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

FIG. 1 is a block diagram of a wavelength division multiplexing (WDM) system 100. WDM system 100 is illustrated as using conventional techniques for WDM. However, WDM system 100 is not necessarily incompatible with the teachings of the present specification. Rather, in some embodiments, a system or subsystem in accordance with WDM 100 may reside alongside, or in conjunction with, a system embodying the teachings of the present specification.

WDM enables transmitting data on multiple optical signal channels in a single optical fiber by using different carrier wavelengths of laser light. WDM greatly enhances the data transmission capacity of an individual fiber.

As illustrated in WDM system 100, this is conventionally achieved by combining multiple independent lasers of distinct wavelengths. For example, laser cavity 1 104 produces a laser with wavelength $\lambda_1$. Laser cavity 2 108 produces a laser with wavelength $\lambda_2$. Laser cavity 3 112 produces a laser with wavelength $\lambda_3$. Laser cavity 4 116 produces a laser with wavelength $\lambda_4$. As described above, these can coexist in a single fiber, and can be treated as different channels for demodulation purposes at the receive end.

Modulators 120 are used to modulate data onto the carrier lasers provided by the respective laser cavities. The data modulated lasers are then provided to a frequency multiplexer 124, which multiplexes the four frequencies together. The output laser pulse includes lasers with wavelengths $\lambda_1$, $\lambda_2$, $\lambda_3$, and $\lambda_4$.

Unfortunately, this configuration takes a relatively large surface area to integrate the lasers and multiplexer onto a single chip. This also requires precise control of the wavelengths of the lasers and the multiplexer to compensate for fabrication variations and wavelength drifts during operation.

Figure 2:
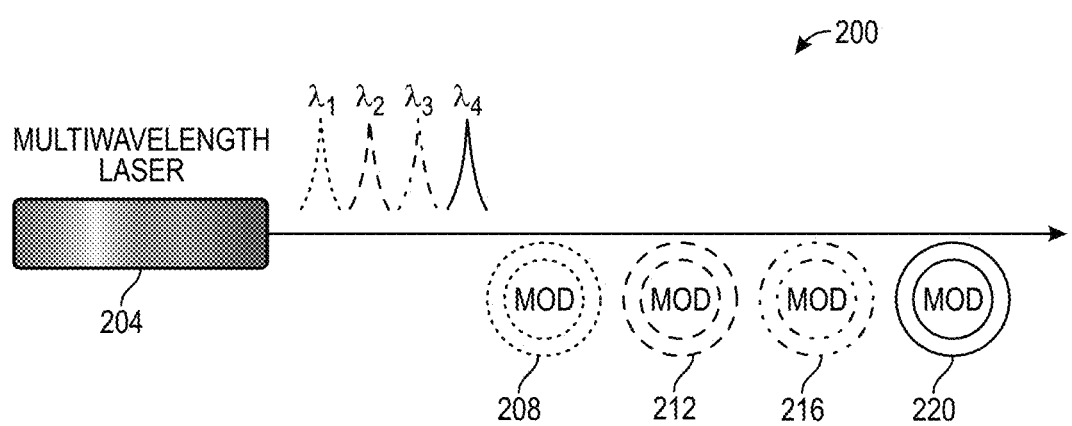
FIG. 2 is a block diagram of a multi-wavelength distributed feedback (DFB) laser.

FIG. 2 is a block diagram of a multi-wavelength distributed feedback (DFB) laser 200. Multi-wavelength DFB laser 200 can generate multiple wavelengths in a single laser cavity 204, thus saving chip area and eliminating the multiplexer. This also alleviates requirements for precise wavelength, therefore enabling low-cost, on-chip WDM transmission.

As illustrated in FIG. 1, a conventional DFB laser cavity (such as cavity 104, 108, 112, or 116) includes a quarter-wave, phase shifted Bragg grating. The laser wavelength depends on the period of the grating. But as illustrated in FIG. 2, a laser cavity 204 constructed according to the teachings of the present specification can generate multiple wavelengths in the single laser cavity. To generate multiple wavelengths in single laser cavity 204 of FIG. 2, several Bragg gratings are superimposed over one another. Each individual Bragg grating has a designated period that corresponds to one laser wavelength. The superimposed gratings together form a single complex grating.

Furthermore, the position of the quarter-wave phase shifter in each underlying grating can be offset from each other grating to avoid mode competitions. In other words, the peak power for each selected wavelength will be delivered at a different point in the laser gain section. Because of the spatial offset of the phase shifts, the optical power of each wavelength can be individually adjusted using segmented electrodes. Furthermore, the superimposed grating structure may be simplified by phase/amplitude sampling to enable fabrication of a grating in a complementary metal oxide semiconductor (CMOS) fab.

Referring again to FIG. 1, in a conventional DFB laser, only one wavelength is generated per laser cavity 104, 108, 112, and 116. In a WDM system such as WDM transmitter 100, multiple cavities 104, 108, 112, and 116, plus a multiplexer 124 may be necessary to combine these wavelengths. The structures illustrated in WDM transmitter 100 consume a relatively large surface area on a chip, which could be used for other components if it were freed up.

WDM transmitter 200 of FIG. 2 consumes much less surface area and thus frees up area for use by other components.

In DFB transmitter 200, multiple laser wavelengths can be simultaneously generated from a single laser cavity that is the same size as a conventional DFB laser. Multi-wavelength laser 200 of FIG. 2 has several advantages compared to WDM laser 100 of FIG. 1.

For example, DFB laser 200 uses ring modulators 208, 212, 216, and 220 to modulate data onto the carrier wavelengths. Ring modulators 208, 212, 216, and 220 are wavelength selective modulators, and are a relatively small type of modulator. The use of multi-wavelength cavity 204 and ring modulators 208, 212, 216, and 220 eliminate the need for a multiplexer on the transmit end of a system. This enables a compact WDM transmitter with a minimal number of components, which saves expensive chip area. This means that it is cost-effective, and is especially beneficial when a larger number of wavelengths are needed.

The illustrated multi-wavelength laser 200 also better utilizes the cavity gain, and is therefore more energy efficient compared to single-wavelength DFB laser arrays such as array 100 of FIG. 1. This efficiency can be seen in FIG. 3.

Because all of the wavelengths are generated from a single laser cavity 204, the wavelengths shift together when environmental conditions and laser parameters change (e.g., bias current, temperature, etcetera). This makes it easier to track and control the wavelengths.

Furthermore, in addition to optical communications, stable beat frequencies can be generated by mixing two laser lines, for microwave to terahertz signal generation.

Figure 3:
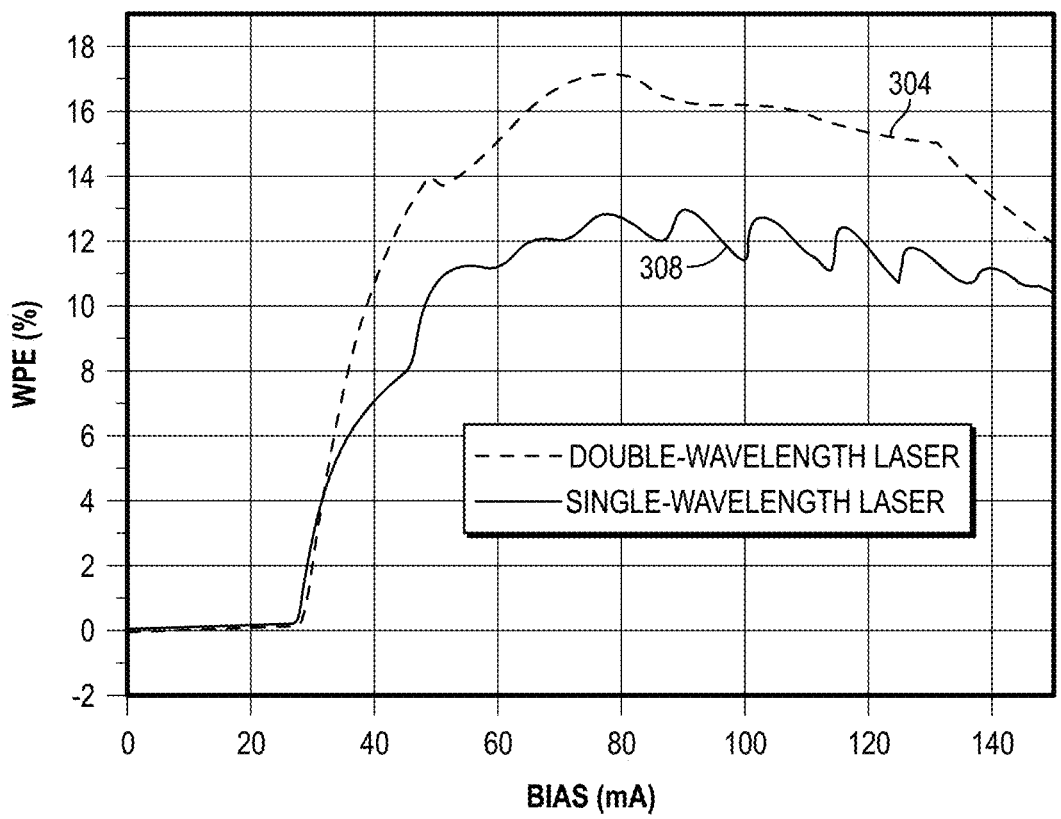
FIG. 3 is a graph illustrating the efficiency of a double-wavelength, single-cavity DFB laser.

FIG. 3 is a graph illustrating the efficiency of a double-wavelength, single-cavity DFB laser compared to a single-wavelength laser per cavity. FIG. 3 illustrates the experimentally measured wall plug efficiencies (WPE) in percent. Graph line 304 illustrates the WPE for a double-wavelength laser compared to graph line 308, which illustrates the WPE for a single-wavelength laser. The efficiencies are illustrated across a range of bias currents from approximately 0 to approximately 150 milliamps (mA). As seen in the graph, both graph lines increase sharply once the bias current crosses over the threshold current of the device. Above the threshold current, it can be seen that the double-wavelength laser consistently performs at higher efficiency than the single-wavelength laser.

Figure 4:
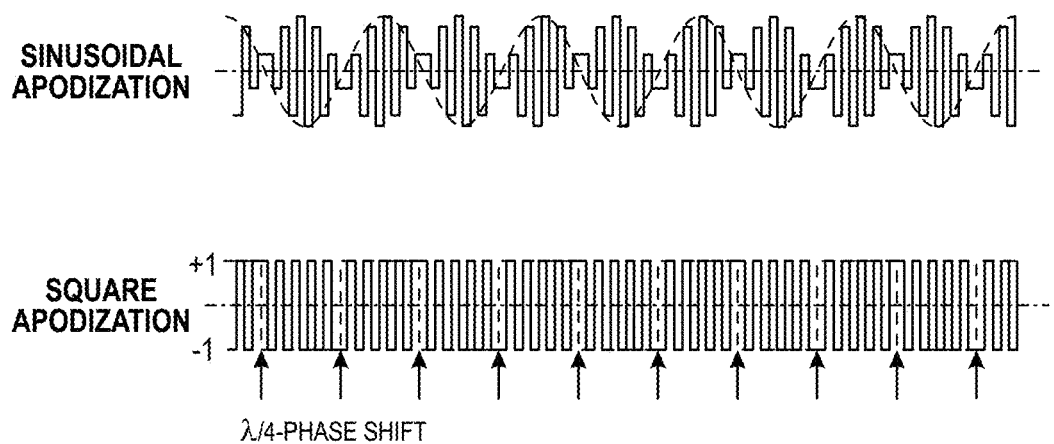
FIG. 4 is a block diagram illustrating design principles of an improved Bragg grating.

FIG. 4 is a block diagram illustrating design principles of an improved Bragg grating. In a conventional DFB laser, the laser cavity is formed by a Bragg grating, an optical waveguide with periodic refractive index perturbation $\Delta n(z)$ that can be mathematically described as follows:

$$\Delta n(z) = \Delta n_0 \cdot \exp\left(j\frac{2\pi}{\Lambda}z\right) \quad (1)$$

In equation 1 above, z is the light propagation direction. $\Lambda$ is the grating period which determines the wavelength $\lambda$ of the resulting laser, $\lambda = 2n_{eff}\Lambda$, with $n_{eff}$ being the effective refractive index of the laser cavity (i.e., waveguide).

In order to generate more than one laser wavelength, Bragg gratings with different periods are needed in the laser cavity. For example, to generate two wavelengths $\lambda_1$ and $\lambda_2$, two gratings, with period $\Lambda_1$ and $\Lambda_2$ respectively, are required, where $\Lambda_{1,2} = \lambda_{1,2}/2n_{eff}$. Since a Bragg grating is a linear optical component, one can superimpose these two gratings to form one, complex grating, which can be described as follows:

$$\Delta n_{1+2}(z) = \frac{1}{2}\Delta n_0 \cdot \exp\left(j\frac{2\pi}{\Lambda_1}z\right) + \frac{1}{2}\Delta n_0 \cdot \exp\left(j\frac{2\pi}{\Lambda_2}z\right) = \quad (2)$$
$$\Delta n_0 \cos\left(j\frac{2\pi}{P}z\right) \cdot \exp\left(j\frac{2\pi}{\Lambda_0}z\right)$$

where $$P = \frac{\Lambda_0^2}{\Delta\Lambda} \quad (3)$$

and $$\Lambda_0 = \frac{\Lambda_1 + \Lambda_2}{2}, \Delta\Lambda = \frac{\Lambda_1 - \Lambda_2}{2}$$

Equation 2 above suggests that the superimposed grating $\Delta n_{1+2}$ is a baseline grating with period $\Lambda_0$ and is apodized (e.g., modulated) by a sinusoidal function $$\cos\left(j\frac{2\pi}{P}z\right).$$

However, the sinusoidal apodization is difficult to fabricate. To achieve a first order approximation, a square wave is used to replace the sinusoidal function:

$$\Delta n_{1+2}(z) = \Delta n_0 \text{sgn}\left(\cos\left(j\frac{2\pi}{P}z\right)\right) \cdot \exp\left(j\frac{2\pi}{\Lambda_0}z\right) \quad (4)$$

In the above, sgn(x) is a sign function (sgn(x)=1 when x≥0, sgn(x)=−1 when x<0). The resulting grating structure, which is essentially a sampled grating, is shown in FIG. 4. Note that negative modulation (sgn(x)=−1) means an additional $\pi$ phase ($e^{j\pi}$) is required, which is physically achieved by shifting the corresponding grating section by a quarter of the laser wavelength (i.e., $\lambda/4$ phase shift), as shown in FIG. 4.

Based on the sampled grating, the design procedure of multi-wavelength lasers is described as follows. Though a dual-wavelength laser design is illustrated by way of non-limiting example, the design procedure applies generally to multi-wavelength lasers. To generate two wavelengths ($\lambda_1$ and $\lambda_2$), first two seed gratings are taken into account, the periods of which ($\Lambda_{1,2}$) correspond to the two wavelengths $\Lambda_{1,2} = \lambda_{1,2}/2_{eff}$, as shown in FIG. 5.

Figure 5:
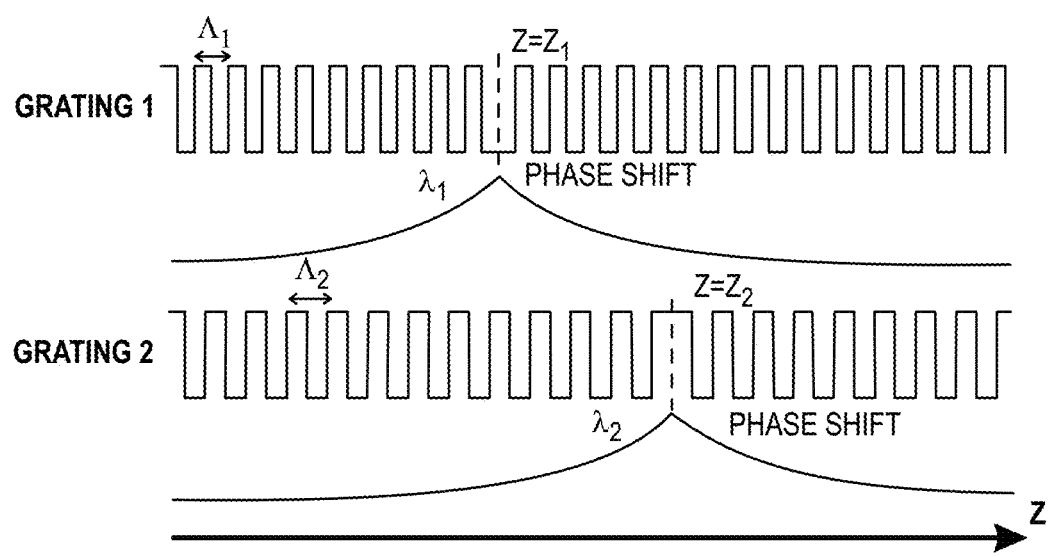
FIG. 5 is a block diagram illustrating phase shift peaks of a dual-wavelength laser.

FIG. 5 is a block diagram illustrating phase shift peaks of a dual-wavelength laser. Grating 1 and grating 2 are seed gratings of the same length, L, and each includes a phase shift, similar to a conventional Bragg grating used in DFB laser cavities. However, the phase shifts in the seed gratings are spatially separated. The phase shift in grating 1 locates at $z=z_1$ and the phase shift of grating 2 locates at $z=z_2$. This is because the light field in a DFB laser usually peaks at the phase shift, as shown in FIG. 5. Spatial separation of the phase shifts avoids mode competition between the two wavelengths and therefore enables stable multi-wavelength lasing. The two seed gratings shown in FIG. 5 can be described as:

$$\Delta n_1(z) = \quad (5)$$
$$\begin{cases} \Delta n_0 \cdot \exp\left(j\frac{2\pi}{\Lambda_1}z\right), z < z_1 \\ -\Delta n_0 \cdot \exp\left(j\frac{2\pi}{\Lambda_1}z\right), z \geq z_1 \end{cases}, \Delta n_2(z) = \begin{cases} \Delta n_0 \cdot \exp\left(j\frac{2\pi}{\Lambda_2}z\right), z < z_2 \\ -\Delta n_0 \cdot \exp\left(j\frac{2\pi}{\Lambda_2}z\right), z \geq z_2 \end{cases}$$

Adding up the two seed gratings yields the following:

$$\Delta n_{1+2}(z) = \begin{cases} \Delta n0 \cdot \text{sgn}\left(\cos\left(j\frac{2\pi}{P}z\right)\right) \cdot \exp\left(j\frac{2\pi}{\Lambda_0}z\right), & z < z_1 \\ -j \cdot \Delta n0 \cdot \text{sgn}\left(\sin\left(j\frac{2\pi}{P}z\right)\right) \cdot \exp\left(j\frac{2\pi}{\Lambda_0}z\right), & z_1 \leq z < z_2 \\ -\Delta n0 \cdot \text{sgn}\left(\cos\left(j\frac{2\pi}{P}z\right)\right) \cdot \exp\left(j\frac{2\pi}{\Lambda_0}z\right), & z \geq z_2 \end{cases} \quad (6)$$

The superimposed grating can then be formed using equation 6 above as the laser cavity to generate a dual-wavelength laser with wavelengths $\lambda_1$ and $\lambda_2$.

Figure 6A:
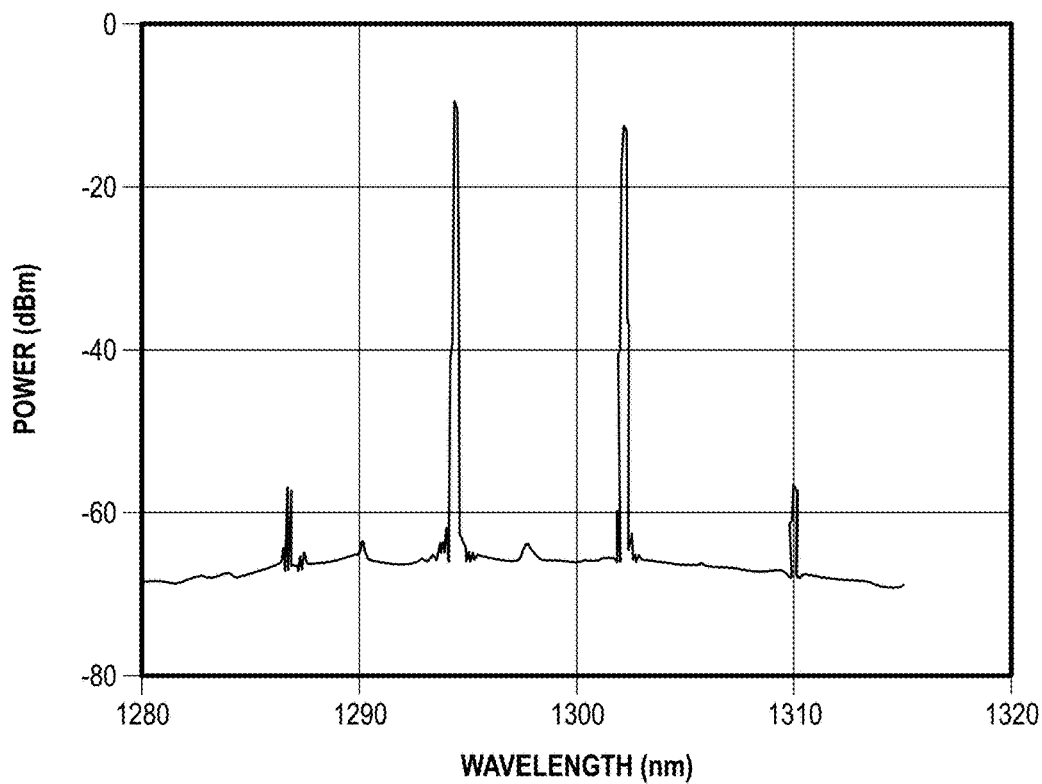
FIGS. 6A and 6B illustrate the measured laser spectra of a dual-wavelength and four-wavelength laser, respectively.
Figure 6B:
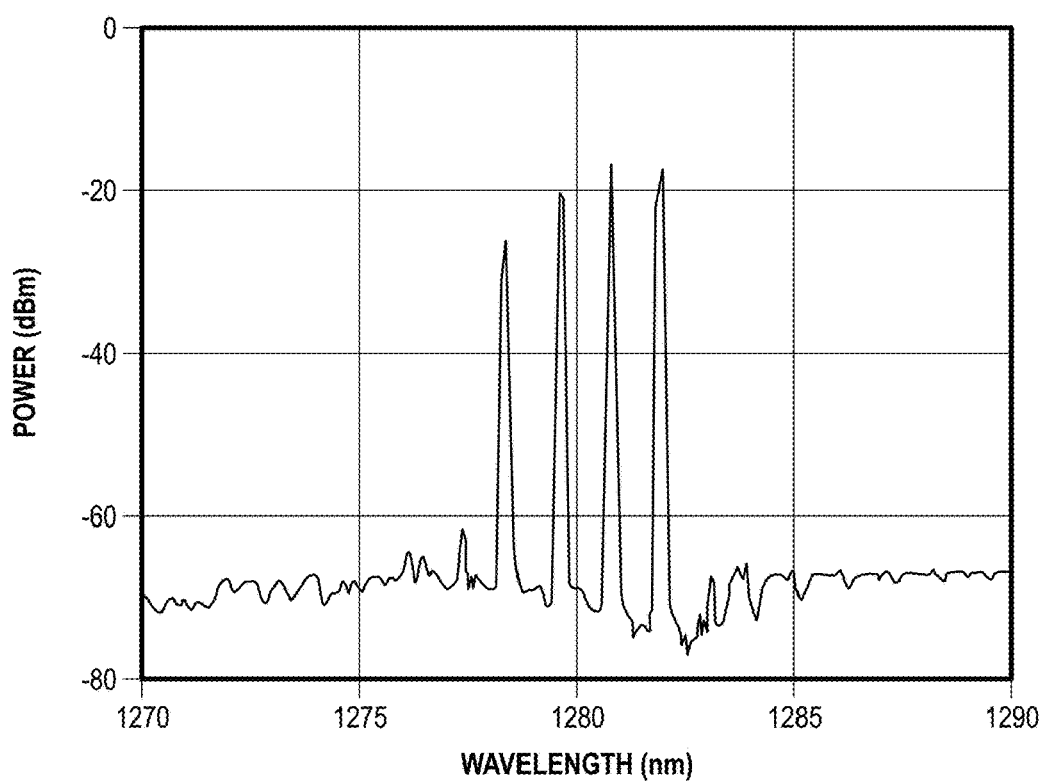

FIGS. 6A and 6B illustrate the measured laser spectra of a dual-wavelength and a four-wavelength laser, respectively. Experimentally, a multi-wavelength laser was fabricated according to the teachings of the present specification. This was used in conjunction with a silicon waveguide with a hybrid III-V/silicon gain to achieve multi-wavelength lasering. The laser spectra of FIGS. 6A and 6B represent a dual-wavelength laser with a wavelength spacing of 7.8 nanometers (nm), and a four-wavelength laser with a wavelength spacing of 1.0 nm, respectively. These are illustrated as examples of the design principles of the present specification. As illustrated in equation 3 above, the wavelength spacing can be controlled by sampling period P. Initial experimental results showed that when the multi-wavelength laser is used in conjunction with a series of micro-ring modulators to form a WDM optical communication link, negligible modulation crosstalk is observed.

Figure 7A:
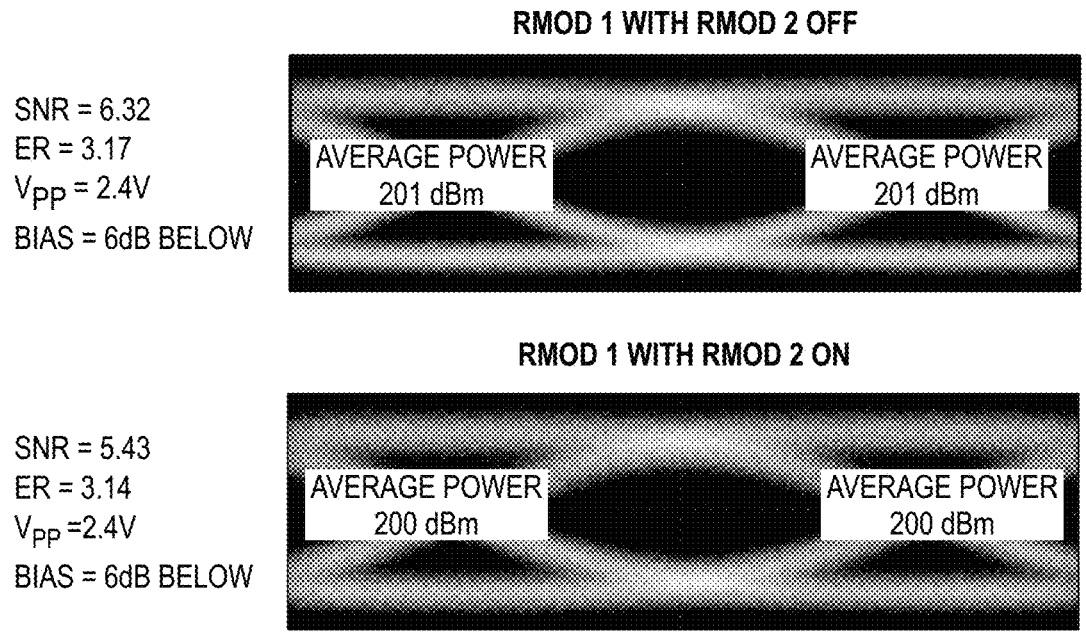
FIGS. 7A and 7B illustrate crosstalk measured experimentally in an example system.
Figure 7B:
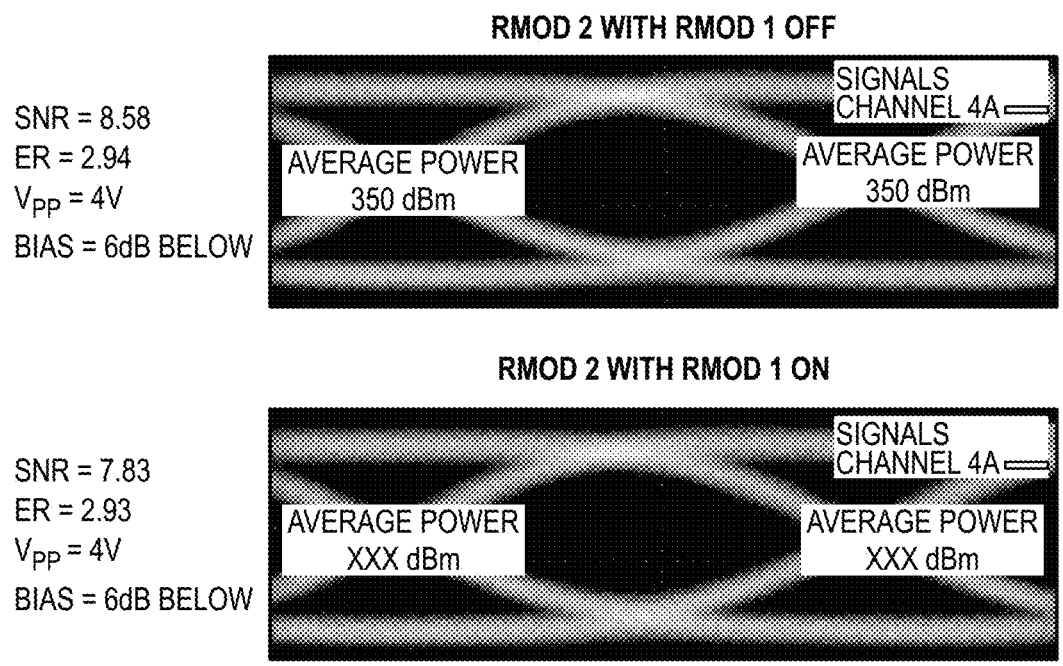

FIGS. 7A and 7B illustrate crosstalk measured experimentally in an example system. In FIG. 7A, wavelength 1 is illustrated with wavelength λ, both off and on. In FIG. 7B, wavelength 2 is illustrated with wavelength 1 both off and on.

FIGS. 7A and 7B illustrate the measured eye diagrams at 56 gigabits (Gb) per second of a communication link, including multi-wavelength lasers of two wavelengths, with two micro-ring modulators. It is seen in these graphs that the modulation performance of one wavelength channel is negligibly affected by the status of the other wavelength channel, providing the practicality of using the illustrated multi-wavelength lasers in a WDM link.

Specifically, in FIG. 7A, with the eye of wavelength 1 measured with wavelength 2 off, the signal-to-noise ratio (SNR) is 6.32. When wavelength 2 is switched on, the SNR drops only to 5.43.

In FIG. 7B, wavelength 2 is illustrated with wavelength 1 both on and off. With wavelength 1 off, the SNR is 8.58. With wavelength 1 on, the SNR drops only to 7.83.

Figure 8:
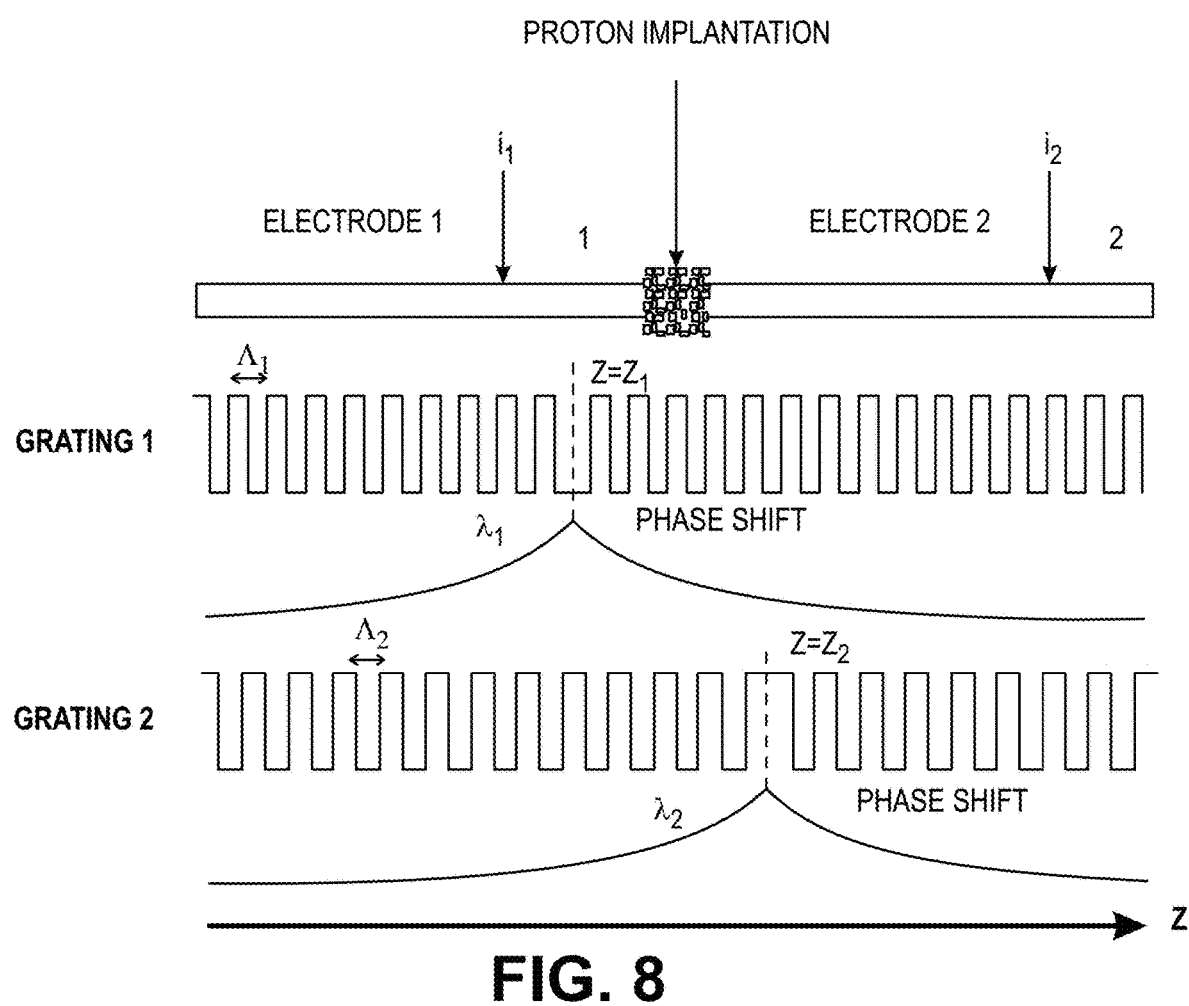
FIG. 8 is an illustration of segmented electrodes that may be used in conjunction with the present specification.

FIG. 8 is an illustration of segmented electrodes that may be used in conjunction with the present specification. One challenge of multi-wavelength lasers is that, as illustrated in FIGS. 6A and 6B, the power outputs of the lasers may not be equally balanced. For example, in FIG. 6A, the leftmost wavelength has higher average power than the rightmost wavelength. Likewise, in FIG. 6B, different wavelengths have different powers.

To overcome this unbalancing issue, segmented electrodes may be used as illustrated in FIG. 8. FIG. 8 illustrates a two-wavelength case to illustrate the design principles. In this case, electrode 1 contributes more to the gain of $\lambda_1$ while electrode 2 contributes more to the gain of $\lambda_2$. Therefore, the two electrodes can be driven with different injection currents ($i_1$ and $i_2$, respectively) to balance the output power of the two wavelengths. The separation of segmented electrodes can be precisely fabricated using proton implantation with lithographically defined registration accuracy.

Figure 9:
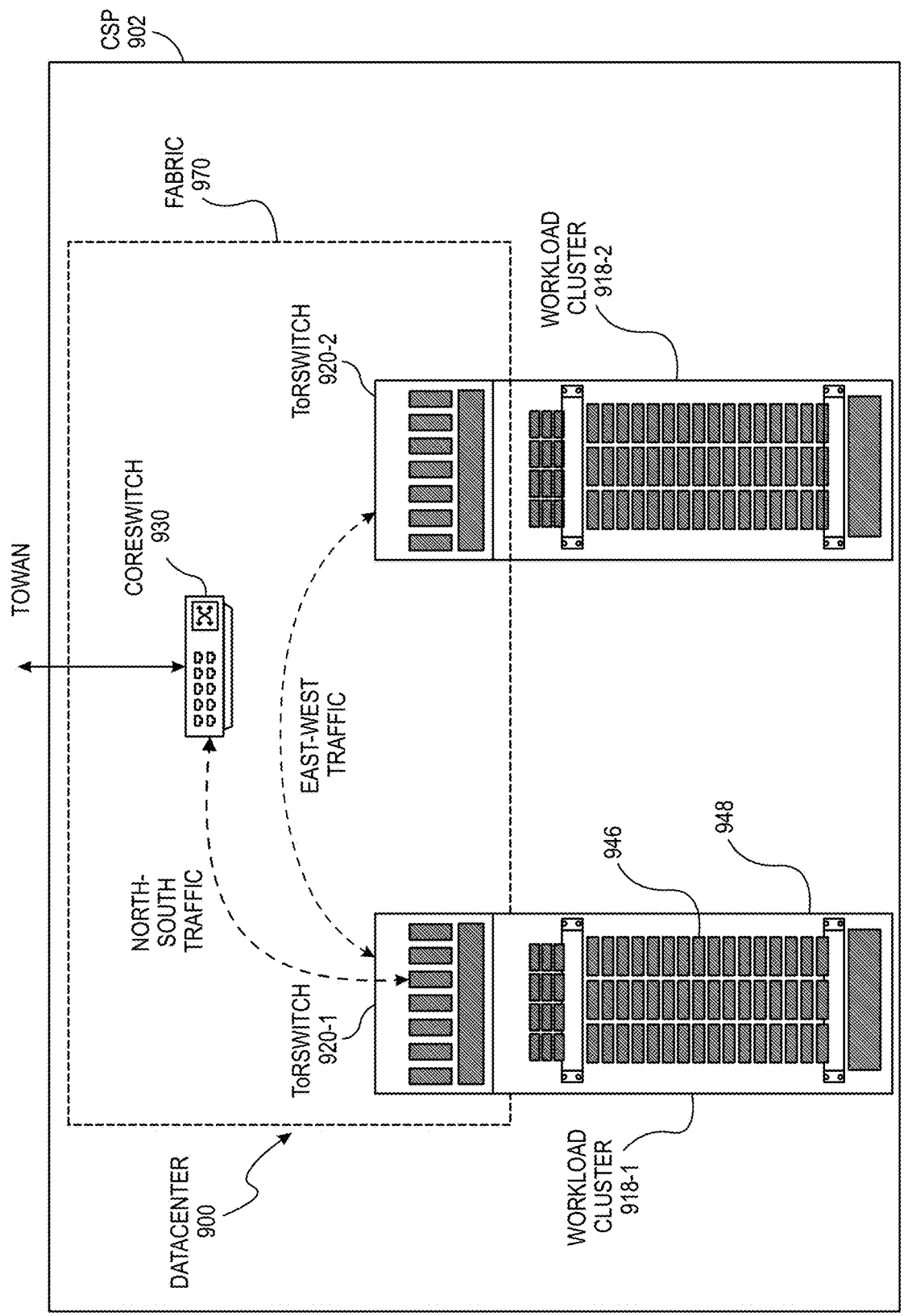
FIG. 9 is a block diagram of selected components of a data center with network connectivity.

FIG. 9 is a block diagram of selected components of a data center 900 with network connectivity. Embodiments of data center 900 disclosed herein may be adapted or configured to provide a multi-wavelength laser, according to the teachings of the present specification. Data center 900 is disclosed in this illustration as a data center operated by a CSP 902, but this is an illustrative example only. The principles illustrated herein may also be applicable to an HPC cluster, a smaller "edge" data center, a microcloud, or other interconnected compute structure.

CSP 902 may be, by way of nonlimiting example, a traditional enterprise data center, an enterprise "private cloud," or a "public cloud," providing services such as infrastructure as a service (IaaS), platform as a service (PaaS), or software as a service (SaaS). In some cases, CSP 902 may provide, instead of or in addition to cloud services, HPC platforms or services. Indeed, while not expressly identical, HPC clusters ("supercomputers") may be structurally similar to cloud data centers, and unless expressly specified, the teachings of this specification may be applied to either. In general usage, the "cloud" is considered to be separate from an enterprise data center. Whereas an enterprise data center may be owned and operated on-site by an enterprise, a CSP provides third-party compute services to a plurality of "tenants." Each tenant may be a separate user or enterprise, and may have its own allocated resources, SLAs, and similar.

CSP 902 may provision some number of workload clusters 918, which may be clusters of individual servers, blade servers, rackmount servers, or any other suitable server topology. In this illustrative example, two workload clusters, 918-1 and 918-2 are shown, each providing rackmount servers 946 in a chassis 948.

In this illustration, workload clusters 918 are shown as modular workload clusters conforming to the rack unit ("U") standard, in which a standard rack, 19 inches wide, may accommodate up to 42 units (42U), each 1.75 inches high and approximately 36 inches deep. In this case, compute resources such as processors, memory, storage, accelerators, and switches may fit into some multiple of rack units from 1U to 42U.

In the case of a traditional rack-based data center, each server 946 may host a standalone operating system and provide a server function, or servers may be virtualized, in which case they may be under the control of a virtual machine manager (VMM), hypervisor, and/or orchestrator. Each server may then host one or more virtual machines, virtual servers, or virtual appliances. These server racks may be collocated in a single data center, or may be located in different geographic data centers. Depending on contractual agreements, some servers 946 may be specifically dedicated to certain enterprise clients or tenants, while others may be shared.

The various devices in a data center may be connected to each other via a switching fabric 970, which may include one or more high speed routing and/or switching devices. Switching fabric 970 may provide both "north-south" traffic (e.g., traffic to and from the wide area network (WAN), such as the Internet), and "east-west" traffic (e.g., traffic across the data center). Historically, north-south traffic accounted for the bulk of network traffic, but as web services become more complex and distributed, the volume of east-west traffic has risen. In many data centers, east-west traffic now accounts for the majority of traffic.

Furthermore, as the capability of each server 946 increases, traffic volume may further increase. For example, each server 946 may provide multiple processor slots, with each slot accommodating a processor having four to eight cores, along with sufficient memory for the cores. Thus, each server may host a number of virtual machines (VMs), each generating its own traffic.

To accommodate the large volume of traffic in a data center, a highly capable switching fabric 970 may be provided. As used throughout this specification, a "fabric" should be broadly understood to include any combination of physical interconnects, protocols, media, and support resources that provide communication between one or more first discrete devices and one or more second discrete devices. Fabrics may be one-to-one, one-to-many, many-to-one, or many-to-many.

In some embodiments, fabric 970 may provide communication services on various "layers," as outlined in the Open Systems Interconnection (OSI) seven-layer network model. In contemporary practice, the OSI model is not followed strictly. In general terms, layers 1 and 2 are often called the "Ethernet" layer (though in some data centers or supercomputers, Ethernet may be supplanted or supplemented by newer technologies). Layers 3 and 4 are often referred to as the transmission control protocol/internet protocol (TCP/IP) layer (which may be further subdivided into TCP and IP layers). Layers 5-7 may be referred to as the "application layer." These layer definitions are disclosed as a useful framework, but are intended to be nonlimiting.

Switching fabric 970 is illustrated in this example as a "flat" network, wherein each server 946 may have a direct connection to a top-of-rack (ToR) switch 920 (e.g., a "star" configuration). Note that ToR is a common and historical name, and ToR switch 920 may, in fact, be located anywhere on the rack. Some data centers place ToR switch 920 in the middle of the rack to reduce the average overall cable length.

Each ToR switch 920 may couple to a core switch 930. This two-tier flat network architecture is shown only as an illustrative example. In other examples, other architectures may be used, such as three-tier star or leaf-spine (also called "fat tree" topologies) based on the "Clos" architecture, hub-and-spoke topologies, mesh topologies, ring topologies, or 3-D mesh topologies, by way of nonlimiting example.

The fabric itself may be provided by any suitable interconnect. For example, each server 946 may include an Intel® Host Fabric Interface (HFI), a network interface card (NIC), intelligent NIC (iNIC), smart NIC, a host channel adapter (HCA), or other host interface. For simplicity and unity, these may be referred to throughout this specification as a "fabric adapter" (FA), which should be broadly construed as an interface to communicatively couple the host to the data center fabric. The FA may couple to one or more host processors via an interconnect or bus, such as PCI, PCIe, or similar, referred to herein as a "local fabric." Multiple processors may communicate with one another via a special interconnect such as a core-to-core Ultra Path Interconnect (UPI), Infinity Fabric, etc. Generically, these interconnects may be referred to as an "inter-processor fabric." The treatment of these various fabrics may vary from vendor to vendor and from architecture to architecture. In some cases, one or both of the local fabric and the inter-processor fabric may be treated as part of the larger data center fabric 972. Some FAs have the capability to dynamically handle a physical connection with a plurality of protocols (e.g., either Ethernet or PCIe, depending on the context), in which case PCIe connections to other parts of a rack may usefully be treated as part of fabric 972. In other embodiments, PCIe is used exclusively within a local node, sled, or sled chassis, in which case it may not be logical to treat the local fabric as part of data center fabric 972. In yet other embodiments, it is more logically to treat the inter-processor fabric as part of the secure domain of the processor complex, and thus treat it separately from the local fabric and/or data center fabric 972. In particular, the inter-processor fabric may be cache and/or memory-coherent, meaning that coherent devices can map to the same memory address space, with each treating that address space as its own local address space. Many data center fabrics and local fabrics lack coherency, and so it may be beneficial to treat inter-processor fabric, the local fabric, and the data center fabric as one cohesive fabric, or two or three separate fabrics. Furthermore, the illustration of three levels of fabric in this example should not be construed to exclude more or fewer levels of fabrics, or the mixture of other kinds of fabrics. For example, many data centers use copper interconnects for short communication distances, and fiberoptic interconnects for longer distances.

Thus, fabric 970 may be provided by a single interconnect or a hybrid interconnect, such as where PCIe provides on-chip (for a system-on-a-chip) or on-board communication, 1 Gb or 10 Gb copper Ethernet provides relatively short connections to a ToR switch 920, and optical cabling provides relatively longer connections to core switch 930. Interconnect technologies that may be found in the data center include, by way of nonlimiting example, Intel® silicon photonics, an Intel® HFI, a NIC, intelligent NIC (iNIC), smart NIC, an HCA or other host interface, PCI, PCIe, a core-to-core UPI (formerly called QPI or KTI), Infinity Fabric, Intel® Omni-Path™ Architecture (OPA), TrueScale™, FibreChannel, Ethernet, FibreChannel over Ethernet (FCoE), InfiniBand, a legacy interconnect such as a local area network (LAN), a token ring network, a synchronous optical network (SONET), an asynchronous transfer mode (ATM) network, a wireless network such as Wi-Fi or Bluetooth, a "plain old telephone system" (POTS) interconnect or similar, a multi-drop bus, a mesh interconnect, a point-to-point interconnect, a serial interconnect, a parallel bus, a coherent (e.g., cache coherent) bus, a layered protocol architecture, a differential bus, or a Gunning transceiver logic (GTL) bus, to name just a few. The fabric may be cache- and memory-coherent, cache- and memory-non-coherent, or a hybrid of coherent and non-coherent interconnects. Some interconnects are more popular for certain purposes or functions than others, and selecting an appropriate fabric for the instant application is an exercise of ordinary skill. For example, OPA and Infiniband are commonly used in HPC applications, while Ethernet and Fibre-Channel are more popular in cloud data centers. But these examples are expressly nonlimiting, and as data centers evolve fabric technologies similarly evolve.

Note that while high-end fabrics such as OPA are provided herein by way of illustration, more generally, fabric 970 may be any suitable interconnect or bus for the particular application. This could, in some cases, include legacy interconnects like LANs, token ring networks, synchronous optical networks (SONET), ATM networks, wireless networks such as Wi-Fi and Bluetooth, POTS interconnects, or similar. It is also expressly anticipated that in the future, new network technologies may arise to supplement or replace some of those listed here, and any such future network topologies and technologies can be or form a part of fabric 970.

Figure 10:
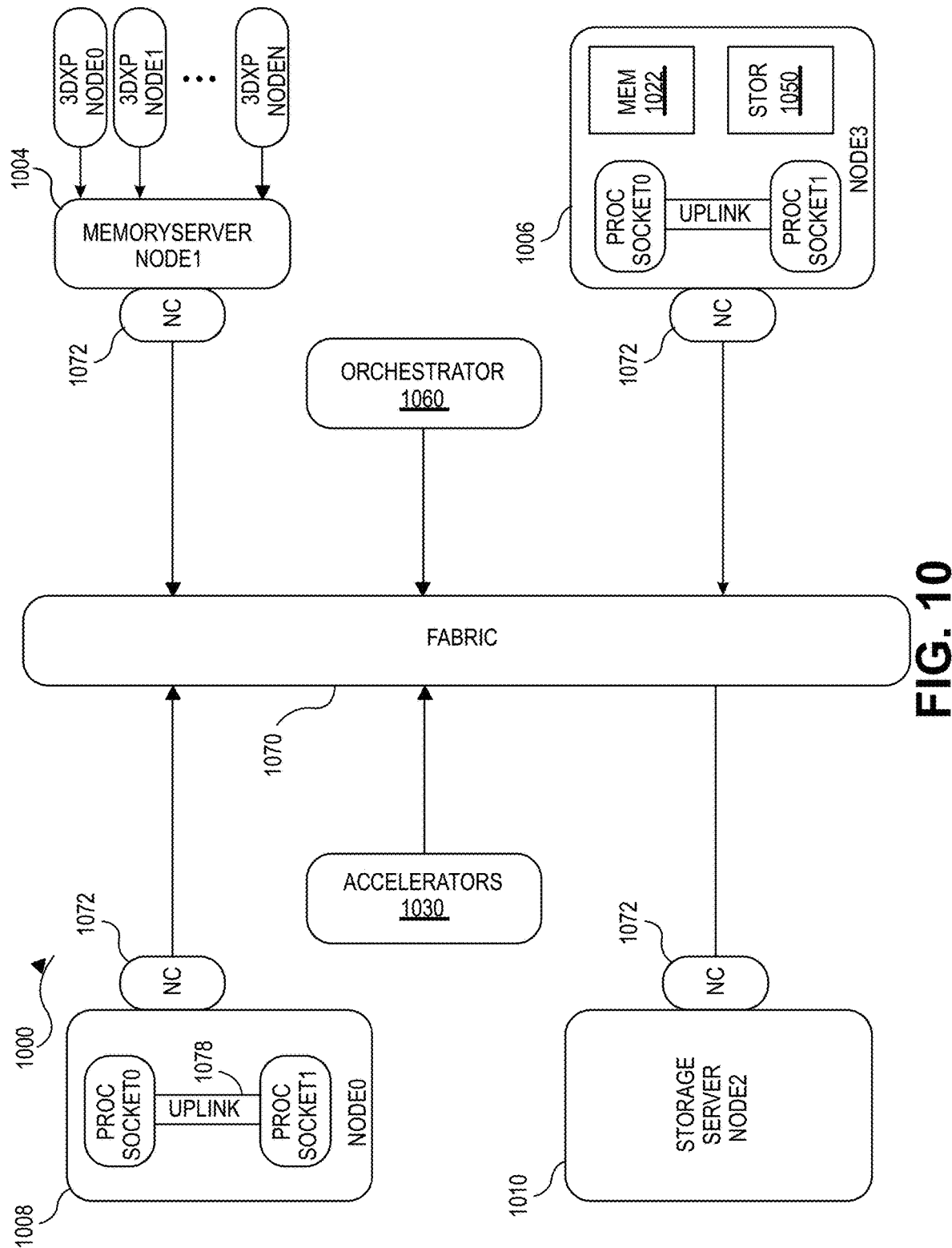
FIG. 10 is a block diagram of selected components of an end-user computing device.

FIG. 10 is a block diagram of an end-user computing device 1000. Embodiments of computing device 1000 disclosed herein may be adapted or configured to provide a multi-wavelength laser, according to the teachings of the present specification. As above, computing device 1000 may provide, as appropriate, cloud service, HPC, telecommunication services, enterprise data center services, or any other compute services that benefit from a computing device 1000.

In this example, a fabric 1070 is provided to interconnect various aspects of computing device 1000. Fabric 1070 may be the same as fabric 970 of FIG. 9, or may be a different fabric. As above, fabric 1070 may be provided by any suitable interconnect technology. In this example, Intel® Omni-Path™ is used as an illustrative and nonlimiting example.

As illustrated, computing device 1000 includes a number of logic elements forming a plurality of nodes. It should be understood that each node may be provided by a physical server, a group of servers, or other hardware. Each server may be running one or more virtual machines as appropriate to its application.

Node 0 1008 is a processing node including a processor socket 0 and processor socket 1. The processors may be, for example, Intel® Xeon™ processors with a plurality of cores, such as 4 or 8 cores. Node 0 1008 may be configured to provide network or workload functions, such as by hosting a plurality of virtual machines or virtual appliances.

On-board communication between processor socket 0 and processor socket 1 may be provided by an on-board uplink 1078. This may provide a very high speed, short-length interconnect between the two processor sockets, so that virtual machines running on node 0 1008 can communicate with one another at very high speeds. To facilitate this communication, a virtual switch (vSwitch) may be provisioned on node 0 1008, which may be considered to be part of fabric 1070.

Node 0 1008 connects to fabric 1070 via a network controller (NC) 1072. NC 1072 provides physical interface (a PHY level) and logic to communicatively couple a device to a fabric. For example, NC 1072 may be a NIC to communicatively couple to an Ethernet fabric or an HFI to communicatively couple to a clustering fabric such as an Intel® Omni-Path™, by way of illustrative and nonlimiting example. In some examples, communication with fabric 1070 may be tunneled, such as by providing UPI tunneling over Omni-Path™.

Because computing device 1000 may provide many functions in a distributed fashion that in previous generations were provided on-board, a highly capable NC 1072 may be provided. NC 1072 may operate at speeds of multiple gigabits per second, and in some cases may be tightly coupled with node 0 1008. For example, in some embodiments, the logic for NC 1072 is integrated directly with the processors on a system-on-a-chip (SoC). This provides very high speed communication between NC 1072 and the processor sockets, without the need for intermediary bus devices, which may introduce additional latency into the fabric. However, this is not to imply that embodiments where NC 1072 is provided over a traditional bus are to be excluded. Rather, it is expressly anticipated that in some examples, NC 1072 may be provided on a bus, such as a PCIe bus, which is a serialized version of PCI that provides higher speeds than traditional PCI. Throughout computing device 1000, various nodes may provide different types of NCs 1072, such as on-board NCs and plug-in NCs. It should also be noted that certain blocks in an SoC may be provided as IP blocks that can be "dropped" into an integrated circuit as a modular unit. Thus, NC 1072 may in some cases be derived from such an IP block.

Note that in "the network is the device" fashion, node 0 1008 may provide limited or no on-board memory or storage. Rather, node 0 1008 may rely primarily on distributed services, such as a memory server and a networked storage server. On-board, node 0 1008 may provide only sufficient memory and storage to bootstrap the device and get it communicating with fabric 1070. This kind of distributed architecture is possible because of the very high speeds of contemporary data centers, and may be advantageous because there is no need to over-provision resources for each node. Rather, a large pool of high speed or specialized memory may be dynamically provisioned between a number of nodes, so that each node has access to a large pool of resources, but those resources do not sit idle when that particular node does not need them.

In this example, a node 1 memory server 1004 and a node 2 storage server 1010 provide the operational memory and storage capabilities of node 0 1008. For example, memory server node 1 1004 may provide remote direct memory access (RDMA), whereby node 0 1008 may access memory resources on node 1 1004 via fabric 1070 in a direct memory access fashion, similar to how it would access its own on-board memory. The memory provided by memory server 1004 may be traditional memory, such as double data rate type 3 (DDR3) dynamic random access memory (DRAM), which is volatile, or may be a more exotic type of memory, such as a persistent fast memory (PFM) like Intel® 3D Crosspoint™ (3DXP), which operates at DRAM-like speeds, but is non-volatile.

Similarly, rather than providing an on-board hard disk for node 0 1008, a storage server node 2 1010 may be provided. Storage server 1010 may provide a networked bunch of disks (NBOD), PFM, redundant array of independent disks (RAID), redundant array of independent nodes (RAIN), network-attached storage (NAS), optical storage, tape drives, or other non-volatile memory solutions.

Thus, in performing its designated function, node 0 1008 may access memory from memory server 1004 and store results on storage provided by storage server 1010. Each of these devices couples to fabric 1070 via an NC 1072, which provides fast communication that makes these technologies possible.

By way of further illustration, node 3 1006 is also depicted. Node 3 1006 also includes an NC 1072, along with two processor sockets internally connected by an uplink. However, unlike node 0 1008, node 3 1006 includes its own on-board memory 1022 and storage 1050. Thus, node 3 1006 may be configured to perform its functions primarily on-board, and may not be required to rely upon memory server 1004 and storage server 1010. However, in appropriate circumstances, node 3 1006 may supplement its own on-board memory 1022 and storage 1050 with distributed resources similar to node 0 1008.

Computing device 1000 may also include accelerators 1030. These may provide various accelerated functions, including hardware or co-processor acceleration for functions such as packet processing, encryption, decryption, compression, decompression, network security, or other accelerated functions in the data center. In some examples, accelerators 1030 may include deep learning accelerators that may be directly attached to one or more cores in nodes such as node 0 1008 or node 3 1006. Examples of such accelerators can include, by way of nonlimiting example, Intel® QuickData Technology (QDT), Intel® QuickAssist Technology (QAT), Intel® Direct Cache Access (DCA), Intel® Extended Message Signaled Interrupt (MSI-X), Intel® Receive Side Coalescing (RSC), and other acceleration technologies.

In other embodiments, an accelerator could also be provided as an application-specific integrated circuit (ASIC), field-programmable gate array (FPGA), co-processor, graphics processing unit (GPU), digital signal processor (DSP), or other processing entity, which may optionally be tuned or configured to provide the accelerator function.

The basic building block of the various components disclosed herein may be referred to as "logic elements." Logic elements may include hardware (including, for example, a software-programmable processor, an ASIC, or an FPGA), external hardware (digital, analog, or mixed-signal), software, reciprocating software, services, drivers, interfaces, components, modules, algorithms, sensors, components, firmware, microcode, programmable logic, or objects that can coordinate to achieve a logical operation. Furthermore, some logic elements are provided by a tangible, non-transitory computer-readable medium having stored thereon executable instructions for instructing a processor to perform a certain task. Such a non-transitory medium could include, for example, a hard disk, solid state memory or disk, read-only memory (ROM), PFM (e.g., Intel® 3D Crosspoint™), external storage, RAID, RAIN, NAS, optical storage, tape drive, backup system, cloud storage, or any combination of the foregoing by way of nonlimiting example. Such a medium could also include instructions programmed into an FPGA, or encoded in hardware on an ASIC or processor.

Figure 11:
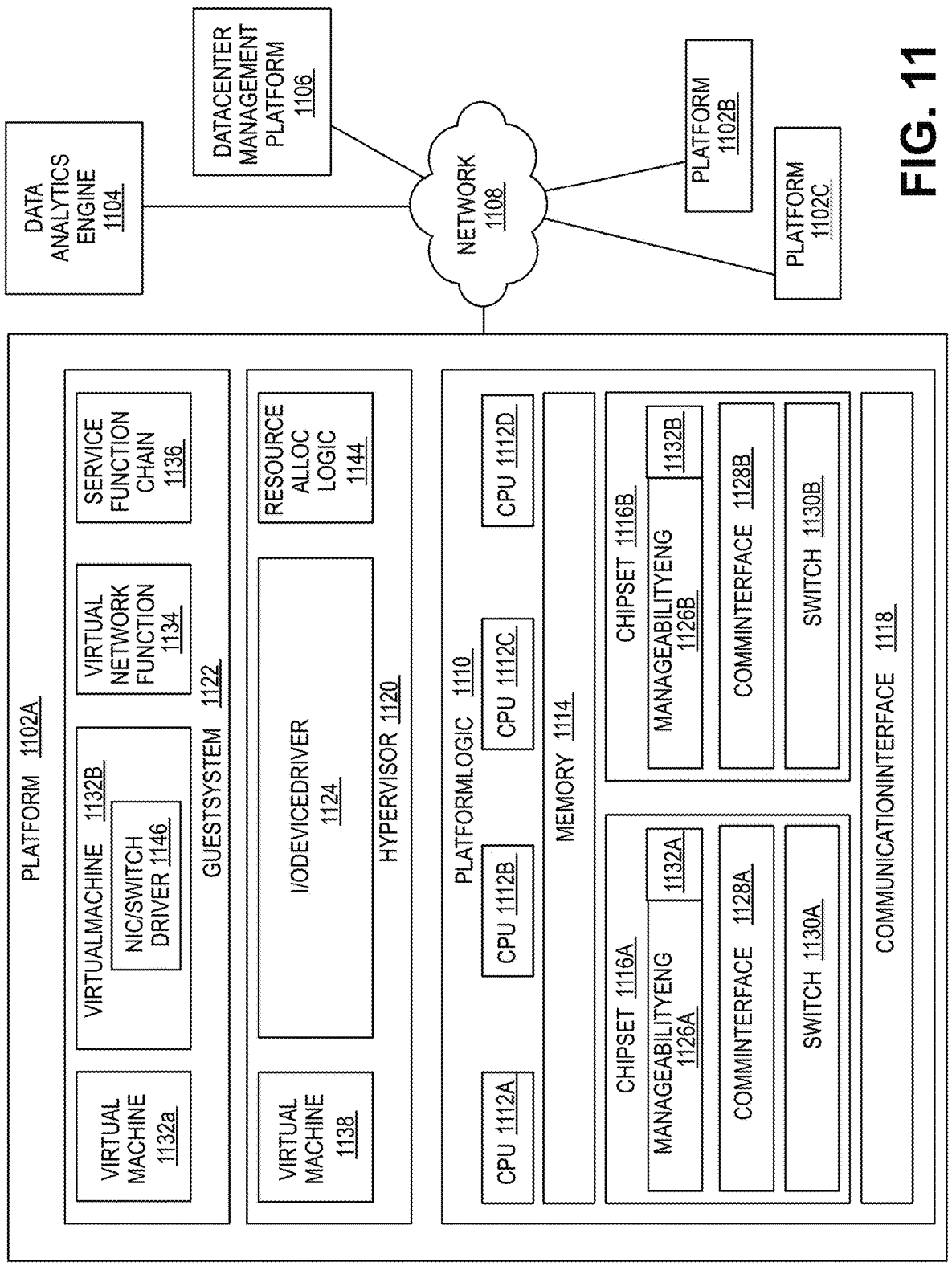
FIG. 11 is a block diagram of components of a computing platform.

FIG. 11 is a block diagram of components of a computing platform 1102A. Embodiments of computing platform 1102A disclosed herein may be adapted or configured to provide a multi-wavelength laser, according to the teachings of the present specification.

In the embodiment depicted, hardware platforms 1102A, 1102B, and 1102C, along with a data center management platform 1106 and data analytics engine 1104 are interconnected via network 1108. In other embodiments, a computer system may include any suitable number of (i.e., one or more) platforms, including hardware, software, firmware, and other components. In some embodiments (e.g., when a computer system only includes a single platform), all or a portion of the system management platform 1106 may be included on a platform 1102. A platform 1102 may include platform logic 1110 with one or more central processing units (CPUs) 1112, memories 1114 (which may include any number of different modules), chipsets 1116, communication interfaces 1118, and any other suitable hardware and/or software to execute a hypervisor 1120 or other operating system capable of executing workloads associated with applications running on platform 1102. In some embodiments, a platform 1102 may function as a host platform for one or more guest systems 1122 that invoke these applications. Platform 1102A may represent any suitable computing environment, such as a high-performance computing environment, a data center, a communications service provider infrastructure (e.g., one or more portions of an Evolved Packet Core), an in-memory computing environment, a computing system of a vehicle (e.g., an automobile or airplane), an Internet of Things environment, an industrial control system, other computing environment, or combination thereof.

In various embodiments of the present disclosure, accumulated stress and/or rates of stress accumulated of a plurality of hardware resources (e.g., cores and uncores) are monitored and entities (e.g., system management platform 1106, hypervisor 1120, or other operating system) of computer platform 1102A may assign hardware resources of platform logic 1110 to perform workloads in accordance with the stress information. In some embodiments, self-diagnostic capabilities may be combined with the stress monitoring to more accurately determine the health of the hardware resources. Each platform 1102 may include platform logic 1110. Platform logic 1110 comprises, among other logic enabling the functionality of platform 1102, one or more CPUs 1112, memory 1114, one or more chipsets 1116, and communication interfaces 1128. Although three platforms are illustrated, computer platform 1102A may be interconnected with any suitable number of platforms. In various embodiments, a platform 1102 may reside on a circuit board that is installed in a chassis, rack, or other suitable structure that comprises multiple platforms coupled together through network 1108 (which may comprise, e.g., a rack or backplane switch).

CPUs 1112 may each comprise any suitable number of processor cores and supporting logic (e.g., uncores). The cores may be coupled to each other, to memory 1114, to at least one chipset 1116, and/or to a communication interface 1118, through one or more controllers residing on CPU 1112 and/or chipset 1116. In particular embodiments, a CPU 1112 is embodied within a socket that is permanently or removably coupled to platform 1102A. Although four CPUs are shown, a platform 1102 may include any suitable number of CPUs.

Memory 1114 may comprise any form of volatile or non-volatile memory including, without limitation, magnetic media (e.g., one or more tape drives), optical media, random access memory (RAM), ROM, flash memory, removable media, or any other suitable local or remote memory component or components. Memory 1114 may be used for short, medium, and/or long-term storage by platform 1102A. Memory 1114 may store any suitable data or information utilized by platform logic 1110, including software embedded in a computer-readable medium, and/or encoded logic incorporated in hardware or otherwise stored (e.g., firmware). Memory 1114 may store data that is used by cores of CPUs 1112. In some embodiments, memory 1114 may also comprise storage for instructions that may be executed by the cores of CPUs 1112 or other processing elements (e.g., logic resident on chipsets 1116) to provide functionality associated with the manageability engine 1126 or other components of platform logic 1110. A platform 1102 may also include one or more chipsets 1116 comprising any suitable logic to support the operation of the CPUs 1112. In various embodiments, chipset 1116 may reside on the same die or package as a CPU 1112 or on one or more different dies or packages. Each chipset may support any suitable number of CPUs 1112. A chipset 1116 may also include one or more controllers to couple other components of platform logic 1110 (e.g., communication interface 1118 or memory 1114) to one or more CPUs. In the embodiment depicted, each chipset 1116 also includes a manageability engine 1126. Manageability engine 1126 may include any suitable logic to support the operation of chipset 1116. In a particular embodiment, a manageability engine 1126 (which may also be referred to as an innovation engine) is capable of collecting real-time telemetry data from the chipset 1116, the CPU(s) 1112 and/or memory 1114 managed by the chipset 1116, other components of platform logic 1110, and/or various connections between components of platform logic 1110. In various embodiments, the telemetry data collected includes the stress information described herein.

In various embodiments, a manageability engine 1126 operates as an out-of-band asynchronous compute agent which is capable of interfacing with the various elements of platform logic 1110 to collect telemetry data with no or minimal disruption to running processes on CPUs 1112. For example, manageability engine 1126 may comprise a dedicated processing element (e.g., a processor, controller, or other logic) on chipset 1116, which provides the functionality of manageability engine 1126 (e.g., by executing software instructions), thus conserving processing cycles of CPUs 1112 for operations associated with the workloads performed by the platform logic 1110. Moreover the dedicated logic for the manageability engine 1126 may operate asynchronously with respect to the CPUs 1112 and may gather at least some of the telemetry data without increasing the load on the CPUs.

A manageability engine 1126 may process telemetry data it collects (specific examples of the processing of stress information are provided herein). In various embodiments, manageability engine 1126 reports the data it collects and/or the results of its processing to other elements in the computer system, such as one or more hypervisors 1120 or other operating systems and/or system management software (which may run on any suitable logic such as system management platform 1106). In particular embodiments, a critical event such as a core that has accumulated an excessive amount of stress may be reported prior to the normal interval for reporting telemetry data (e.g., a notification may be sent immediately upon detection).

Additionally, manageability engine 1126 may include programmable code configurable to set which CPU(s) 1112 a particular chipset 1116 manages and/or which telemetry data may be collected.

Chipsets 1116 also each include a communication interface 1128. Communication interface 1128 may be used for the communication of signaling and/or data between chipset 1116 and one or more I/O devices, one or more networks 1108, and/or one or more devices coupled to network 1108 (e.g., system management platform 1106). For example, communication interface 1128 may be used to send and receive network traffic such as data packets. In a particular embodiment, a communication interface 1128 comprises one or more physical network interface controllers (NICs), also known as network interface cards or network adapters. A NIC may include electronic circuitry to communicate using any suitable physical layer and data link layer standard such as Ethernet (e.g., as defined by a IEEE 802.3 standard), Fibre Channel, InfiniBand, Wi-Fi, or other suitable standard. A NIC may include one or more physical ports that may couple to a cable (e.g., an Ethernet cable). A NIC may enable communication between any suitable element of chipset 1116 (e.g., manageability engine 1126 or switch 1130) and another device coupled to network 1108. In various embodiments a NIC may be integrated with the chipset (i.e., may be on the same integrated circuit or circuit board as the rest of the chipset logic) or may be on a different integrated circuit or circuit board that is electromechanically coupled to the chipset.

In particular embodiments, communication interfaces 1128 may allow communication of data (e.g., between the manageability engine 1126 and the data center management platform 1106) associated with management and monitoring functions performed by manageability engine 1126. In various embodiments, manageability engine 1126 may utilize elements (e.g., one or more NICs) of communication interfaces 1128 to report the telemetry data (e.g., to system management platform 1106) in order to reserve usage of NICs of communication interface 1118 for operations associated with workloads performed by platform logic 1110.

Switches 1130 may couple to various ports (e.g., provided by NICs) of communication interface 1128 and may switch data between these ports and various components of chipset 1116 (e.g., one or more Peripheral Component Interconnect Express (PCIe) lanes coupled to CPUs 1112). Switches 1130 may be a physical or virtual (i.e., software) switch.

Platform logic 1110 may include an additional communication interface 1118. Similar to communication interfaces 1128, communication interfaces 1118 may be used for the communication of signaling and/or data between platform logic 1110 and one or more networks 1108 and one or more devices coupled to the network 1108. For example, communication interface 1118 may be used to send and receive network traffic such as data packets. In a particular embodiment, communication interfaces 1118 comprise one or more physical NICs. These NICs may enable communication between any suitable element of platform logic 1110 (e.g., CPUs 1112 or memory 1114) and another device coupled to network 1108 (e.g., elements of other platforms or remote computing devices coupled to network 1108 through one or more networks).

Platform logic 1110 may receive and perform any suitable types of workloads. A workload may include any request to utilize one or more resources of platform logic 1110, such as one or more cores or associated logic. For example, a workload may comprise a request to instantiate a software component, such as an I/O device driver 1124 or guest system 1122; a request to process a network packet received from a virtual machine 1132 or device external to platform 1102A (such as a network node coupled to network 1108); a request to execute a process or thread associated with a guest system 1122, an application running on platform 1102A, a hypervisor 1120 or other operating system running on platform 1102A; or other suitable processing request.

A virtual machine 1132 may emulate a computer system with its own dedicated hardware. A virtual machine 1132 may run a guest operating system on top of the hypervisor 1120. The components of platform logic 1110 (e.g., CPUs 1112, memory 1114, chipset 1116, and communication interface 1118) may be virtualized such that it appears to the guest operating system that the virtual machine 1132 has its own dedicated components.

A virtual machine 1132 may include a virtualized NIC (vNIC), which is used by the virtual machine as its network interface. A vNIC may be assigned a media access control (MAC) address or other identifier, thus allowing multiple virtual machines 1132 to be individually addressable in a network.

VNF 1134 may comprise a software implementation of a functional building block with defined interfaces and behavior that can be deployed in a virtualized infrastructure. In particular embodiments, a VNF 1134 may include one or more virtual machines 1132 that collectively provide specific functionalities (e.g., WAN optimization, virtual private network (VPN) termination, firewall operations, load balancing operations, security functions, etcetera). A VNF 1134 running on platform logic 1110 may provide the same functionality as traditional network components implemented through dedicated hardware. For example, a VNF 1134 may include components to perform any suitable NFV workloads, such as virtualized evolved packet core (vEPC) components, mobility management entities, 3rd Generation Partnership Project (3GPP) control and data plane components, etc.

SFC 1136 is a group of VNFs 1134 organized as a chain to perform a series of operations, such as network packet processing operations. Service function chaining may provide the ability to define an ordered list of network services (e.g. firewalls, load balancers) that are stitched together in the network to create a service chain.

A hypervisor 1120 (also known as a virtual machine monitor) may comprise logic to create and run guest systems 1122. The hypervisor 1120 may present guest operating systems run by virtual machines with a virtual operating platform (i.e., it appears to the virtual machines that they are running on separate physical nodes when they are actually consolidated onto a single hardware platform) and manage the execution of the guest operating systems by platform logic 1110. Services of hypervisor 1120 may be provided by virtualizing in software or through hardware assisted resources that require minimal software intervention, or both. Multiple instances of a variety of guest operating systems may be managed by the hypervisor 1120. Each platform 1102 may have a separate instantiation of a hypervisor 1120.

Hypervisor 1120 may be a native or bare metal hypervisor that runs directly on platform logic 1110 to control the platform logic and manage the guest operating systems. Alternatively, hypervisor 1120 may be a hosted hypervisor that runs on a host operating system and abstracts the guest operating systems from the host operating system. Hypervisor 1120 may include a virtual switch 1138 that may provide virtual switching and/or routing functions to virtual machines of guest systems 1122. The virtual switch 1138 may comprise a logical switching fabric that couples the vNICs of the virtual machines 1132 to each other, thus creating a virtual network through which virtual machines may communicate with each other.

Virtual switch 1138 may comprise a software element that is executed using components of platform logic 1110. In various embodiments, hypervisor 1120 may be in communication with any suitable entity (e.g., a SDN controller) which may cause hypervisor 1120 to reconfigure the parameters of virtual switch 1138 in response to changing conditions in platform 1102 (e.g., the addition or deletion of virtual machines 1132 or identification of optimizations that may be made to enhance performance of the platform).

Hypervisor 1120 may also include resource allocation logic 1144, which may include logic for determining allocation of platform resources based on the telemetry data (which may include stress information). Resource allocation logic 1144 may also include logic for communicating with various components of platform logic 1110 entities of platform 1102A to implement such optimization, such as components of platform logic 1110.

Any suitable logic may make one or more of these optimization decisions. For example, system management platform 1106; resource allocation logic 1144 of hypervisor 1120 or other operating system; or other logic of computer platform 1102A may be capable of making such decisions. In various embodiments, the system management platform 1106 may receive telemetry data from and manage workload placement across multiple platforms 1102. The system management platform 1106 may communicate with hypervisors 1120 (e.g., in an out-of-band manner) or other operating systems of the various platforms 1102 to implement workload placements directed by the system management platform.

The elements of platform logic 1110 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, or a GTL bus.

Elements of the computer platform 1102A may be coupled together in any suitable manner such as through one or more networks 1108. A network 1108 may be any suitable network or combination of one or more networks operating using one or more suitable networking protocols. A network may represent a series of nodes, points, and interconnected communication paths for receiving and transmitting packets of information that propagate through a communication system. For example, a network may include one or more firewalls, routers, switches, security appliances, antivirus servers, or other useful network devices.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present specification.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

In the foregoing description, certain aspects of some or all embodiments are described in greater detail than is strictly necessary for practicing the appended claims. These details are provided by way of nonlimiting example only, for the purpose of providing context and illustration of the disclosed embodiments. Such details should not be understood to be required, and should not be "read into" the claims as limitations. The phrase may refer to "an embodiment" or "embodiments." These phrases, and any other references to embodiments, should be understood broadly to refer to any combination of one or more embodiments. Furthermore, the several features disclosed in a particular "embodiment" could just as well be spread across multiple embodiments. For example, if features 1 and 2 are disclosed in "an embodiment," embodiment A may have feature 1 but lack feature 2, while embodiment B may have feature 2 but lack feature 1.

This specification may provide illustrations in a block diagram format, wherein certain features are disclosed in separate blocks. These should be understood broadly to disclose how various features interoperate, but are not intended to imply that those features must necessarily be embodied in separate hardware or software. Furthermore, where a single block discloses more than one feature in the same block, those features need not necessarily be embodied in the same hardware and/or software. For example, a computer "memory" could in some circumstances be distributed or mapped between multiple levels of cache or local memory, main memory, battery-backed volatile memory, and various forms of persistent memory such as a hard disk, storage server, optical disk, tape drive, or similar. In certain embodiments, some of the components may be omitted or consolidated. In a general sense, the arrangements depicted in the FIGURES may be more logical in their representations, whereas a physical architecture may include various permutations, combinations, and/or hybrids of these elements. Countless possible design configurations can be used to achieve the operational objectives outlined herein. Accordingly, the associated infrastructure has a myriad of substitute arrangements, design choices, device possibilities, hardware configurations, software implementations, and equipment options.

References may be made herein to a computer-readable medium, which may be a tangible and non-transitory computer-readable medium. As used in this specification and throughout the claims, a "computer-readable medium" should be understood to include one or more computer-readable mediums of the same or different types. A computer-readable medium may include, by way of nonlimiting example, an optical drive (e.g., CD/DVD/Blu-Ray), a hard drive, a solid state drive, a flash memory, or other non-volatile medium. A computer-readable medium could also include a medium such as a ROM, an FPGA, or an ASIC configured to carry out the desired instructions, stored instructions for programming an FPGA or ASIC to carry out the desired instructions, an intellectual property (IP) block that can be integrated in hardware into other circuits, or instructions encoded directly into hardware or microcode on a processor such as a microprocessor, DSP, microcontroller, or in any other suitable component, device, element, or object where appropriate and based on particular needs. A non-transitory storage medium herein is expressly intended to include any non-transitory special-purpose or programmable hardware configured to provide the disclosed operations, or to cause a processor to perform the disclosed operations.

Various elements may be "communicatively," "electrically," "mechanically," or otherwise "coupled" to one another throughout this specification and the claims. Such coupling may be a direct, point-to-point coupling, or may include intermediary devices. For example, two devices may be communicatively coupled to one another via a controller that facilitates the communication. Devices may be electrically coupled to one another via intermediary devices such as signal boosters, voltage dividers, or buffers. Mechanically coupled devices may be indirectly mechanically coupled.

Any "module" or "engine" disclosed herein may refer to or include software, a software stack, a combination of hardware, firmware, and/or software, a circuit configured to carry out the function of the engine or module, or any computer-readable medium as disclosed above. Such modules or engines may, in appropriate circumstances, be provided on or in conjunction with a hardware platform, which may include hardware compute resources such as a processor, memory, storage, interconnects, networks and network interfaces, accelerators, or other suitable hardware. Such a hardware platform may be provided as a single monolithic device (e.g., in a PC form factor), or with some or part of the function being distributed (e.g., a "composite node" in a high-end data center, where compute, memory, storage, and other resources may be dynamically allocated and need not be local to one another).

There may be disclosed herein flow charts, signal flow diagram, or other illustrations showing operations being performed in a particular order. Unless otherwise expressly noted, or unless required in a particular context, the order should be understood to be a nonlimiting example only. Furthermore, in cases where one operation is shown to follow another, other intervening operations may also occur, which may be related or unrelated. Some operations may also be performed simultaneously or in parallel. In cases where an operation is said to be "based on" or "according to" another item or operation, this should be understood to imply that the operation is based at least partly on or according at least partly to the other item or operation. This should not be construed to imply that the operation is based solely or exclusively on, or solely or exclusively according to the item or operation.

All or part of any hardware element disclosed herein may readily be provided in an SoC, including a CPU package. An SoC represents an integrated circuit (IC) that integrates components of a computer or other electronic system into a single chip. Thus, for example, client devices or server devices may be provided, in whole or in part, in an SoC. The SoC may contain digital, analog, mixed-signal, and radio frequency functions, all of which may be provided on a single chip substrate. Other embodiments may include a multichip module (MCM), with a plurality of chips located within a single electronic package and configured to interact closely with each other through the electronic package.

In a general sense, any suitably-configured circuit or processor can execute any type of instructions associated with the data to achieve the operations detailed herein. Any processor disclosed herein could transform an element or an article (for example, data) from one state or thing to another state or thing. Furthermore, the information being tracked, sent, received, or stored in a processor could be provided in any database, register, table, cache, queue, control list, or storage structure, based on particular needs and implementations, all of which could be referenced in any suitable timeframe. Any of the memory or storage elements disclosed herein, should be construed as being encompassed within the broad terms "memory" and "storage," as appropriate.

Computer program logic implementing all or part of the functionality described herein is embodied in various forms, including, but in no way limited to, a source code form, a computer executable form, machine instructions or microcode, programmable hardware, and various intermediate forms (for example, forms generated by an assembler, compiler, linker, or locator). In an example, source code includes a series of computer program instructions implemented in various programming languages, such as an object code, an assembly language, or a high level language such as OpenCL, FORTRAN, C, C++, JAVA, or HTML for use with various operating systems or operating environments, or in hardware description languages such as Spice, Verilog, and VHDL. The source code may define and use various data structures and communication messages. The source code may be in a computer executable form (e.g., via an interpreter), or the source code may be converted (e.g., via a translator, assembler, or compiler) into a computer executable form, or converted to an intermediate form such as byte code. Where appropriate, any of the foregoing may be used to build or describe appropriate discrete or integrated circuits, whether sequential, combinatorial, state machines, or otherwise.

In one example embodiment, any number of electrical circuits of the FIGURES may be implemented on a board of an associated electronic device. The board can be a general circuit board that can hold various components of the internal electronic system of the electronic device and, further, provide connectors for other peripherals. Any suitable processor and memory can be suitably coupled to the board based on particular configuration needs, processing demands, and computing designs. Note that with the numerous examples provided herein, interaction may be described in terms of two, three, four, or more electrical components. However, this has been done for purposes of clarity and example only. It should be appreciated that the system can be consolidated or reconfigured in any suitable manner. Along similar design alternatives, any of the illustrated components, modules, and elements of the FIGURES may be combined in various possible configurations, all of which are within the broad scope of this specification.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 (pre-AIA) or paragraph (f) of the same section (post-AIA), as it exists on the date of the filing hereof unless the words "means for" or "steps for" are specifically used in the particular claims; and (b) does not intend, by any statement in the specification, to limit this disclosure in any way that is not otherwise expressly reflected in the appended claims.

Example Implementations

The following examples are provided by way of illustration.

Example 1 includes a communication system, comprising: a data transmission interface; and a wavelength division multiplexing (WDM) silicon laser source to provide modulated data on a carrier laser via the data transmission interface, the WDM laser comprising a single laser cavity to generate an internally multiplexed multi-wavelength laser, the single laser cavity comprising a filter having a first grating period to generate a first wavelength and a second grating period to generate a second wavelength, the second grating period superimposed on the first grating period.

Example 2 includes the communication system of example 1, wherein the WDM laser is a multi-wavelength distributed feedback laser.

Example 3 includes the communication system of example 1, wherein the filter is a Bragg filter.

Example 4 includes the communication system of example 1, wherein the filter comprises sinusoidal apodization.

Example 5 includes the communication system of example 1, wherein the filter comprises square wave apodization.

Example 6 includes the communication system of example 1, wherein the filter comprises a one-quarter wavelength phase shift.

Example 7 includes the communication system of example 1, wherein the filter comprises a first phase shift for the first wavelength and a second phase shift for the second wavelength, wherein the second phase shift is spatially offset from the first phase shift.

Example 8 includes the communication system of example 1, wherein the filter comprises means to separate peak power of the first wavelength from peak power of the second wavelength.

Example 9 includes the communication system of example 1, further comprising third and fourth grating periods superimposed on the first grating period to generate third and fourth wavelengths respectively.

Example 10 includes the communication system of any of examples 1-9, further comprising a modulator to modulate the data onto the carrier laser.

Example 11 includes the communication system of example 10, wherein the modulator is a ring modulator.

Example 12 includes the communication system of example 10, wherein the modulator comprises a ring modulator per generated frequency.

Example 13 includes an integrated circuit (IC), comprising: a local data interface; a fiberoptic transmitter circuit; and an IC-scale laser to drive the fiberoptic transmitter circuit, the laser comprising a monolithic laser cavity comprising a filter having a first grating period and a second grating period superimposed on the first grating period; whereby the first grating period generates a carrier of a first wavelength and the second grating period generates a carrier of a second wavelength multiplexed with the carrier of the first wavelength.

Example 14 includes the IC of example 13, wherein the IC-scale laser is a multi-wavelength distributed feedback laser.

Example 15 includes the IC of example 13, wherein the filter is a Bragg filter.

Example 16 includes the IC of example 13, wherein the filter has a sinusoidal apodization.

Example 17 includes the IC of example 13, wherein the filter has a square wave apodization.

Example 18 includes the IC of example 13, wherein the second grating period is offset by a one-quarter wavelength phase shift to compensate for negative modulation.

Example 19 includes the IC of example 13, wherein the filter comprises a first phase shift for the first wavelength and a second phase shift for the second wavelength, wherein the second phase shift is spatially offset from the first phase shift.

Example 20 includes the IC of example 13, wherein the filter comprises means to separate peak power of the first wavelength from peak power of the second wavelength.

Example 21 includes the IC of example 13, further comprising third and fourth grating periods superimposed on the first grating period to generate third and fourth wavelengths respectively.

Example 22 includes the IC of any of examples 13-21, further comprising a modulator to modulate data onto the carrier wavelengths.

Example 23 includes the communication system of example 22, wherein the modulator is a ring modulator.

Example 24 includes the communication system of example 22, wherein the modulator comprises a ring modulator per generated frequency.

Example 25 includes a Bragg filter, comprising: a first grating period and a second grating period superimposed on the first grating period, wherein the first grating period is configured to selectively reflect a first wavelength and the second grating period is configured to selectively reflect a second wavelength, and wherein the second grating period is superimposed over the first grating period.

Example 26 includes the Bragg filter of example 25, wherein the first and second grating periods are provided in a sinusoidal apodization structure.

Example 27 includes the Bragg filter of example 25, wherein the first and second grating periods are provided in a square wave apodization structure.

Example 28 includes the Bragg filter of example 25, wherein the second grating period is phase shifted one-quarter wavelength to account for negative modulation.

Example 29 includes the Bragg filter of example 25, wherein the first grating period comprises a first phase shift for the first wavelength, and the second grating period comprises and a second phase shift spatially offset from the first phase shift.

Example 30 includes the Bragg filter of example 25, further comprising means to separate peak power of the first wavelength from peak power of the second wavelength.

Example 31 includes the Bragg filter of example 25, further comprising third and fourth grating periods superimposed on the first grating period to generate third and fourth wavelengths respectively.

What is claimed is:

1. A communication system, comprising:
    a data transmission interface; and
    a wavelength division multiplexing (WDM) silicon laser source to provide modulated data on a carrier laser via the data transmission interface, the WDM laser comprising a single laser cavity to generate an internally multiplexed multi-wavelength laser, the single laser cavity comprising a filter having a first grating period to generate a first wavelength and a second grating period to generate a second wavelength, the second grating period superimposed on the first grating period.

2. The communication system of claim 1, wherein the WDM laser is a multi-wavelength distributed feedback laser.

3. The communication system of claim 1, wherein the filter is a Bragg filter.

4. The communication system of claim 1, wherein the filter comprises sinusoidal apodization.

5. The communication system of claim 1, wherein the filter comprises square wave apodization.

6. The communication system of claim 1, wherein the filter comprises a one-quarter wavelength phase shift.

7. The communication system of claim 1, wherein the filter comprises a first phase shift for the first wavelength and a second phase shift for the second wavelength, wherein the second phase shift is spatially offset from the first phase shift.

8. The communication system of claim 1, wherein the filter comprises means to separate peak power of the first wavelength from peak power of the second wavelength.

9. The communication system of claim 1, further comprising third and fourth grating periods superimposed on the first grating period to generate third and fourth wavelengths respectively.

10. The communication system of claim 1, further comprising a modulator to modulate the data onto the carrier laser.

11. The communication system of claim 10, wherein the modulator is a ring modulator.

12. The communication system of claim 10, wherein the modulator comprises a ring modulator per generated frequency.

13. An integrated circuit (IC), comprising:
    a local data interface;
    a fiberoptic transmitter circuit; and
    an IC-scale laser to drive the fiberoptic transmitter circuit, the laser comprising a monolithic laser cavity comprising a filter having a first grating period and a second grating period superimposed on the first grating period;
    whereby the first grating period generates a carrier of a first wavelength and the second grating period generates a carrier of a second wavelength multiplexed with the carrier of the first wavelength.

14. The IC of claim 13, wherein the filter has a sinusoidal apodization.

15. The IC of claim 13, wherein the filter has a square wave apodization.

16. The IC of claim 13, wherein the filter comprises a first phase shift for the first wavelength and a second phase shift for the second wavelength, wherein the second phase shift is spatially offset from the first phase shift.

17. The IC of claim 13, wherein the filter comprises means to separate peak power of the first wavelength from peak power of the second wavelength.

18. The IC of claim 13, further comprising third and fourth grating periods superimposed on the first grating period to generate third and fourth wavelengths respectively.

19. A Bragg filter, comprising:
    a first grating period and a second grating period superimposed on the first grating period, wherein the first grating period is configured to selectively reflect a first wavelength and the second grating period is configured to selectively reflect a second wavelength, and wherein the second grating period is superimposed over the first grating period.

20. The Bragg filter of claim 19, wherein the first and second grating periods are provided in a square wave apodization structure.

* * * * *